(12) United States Patent
Miyamoto et al.

(10) Patent No.: US 10,381,253 B2
(45) Date of Patent: Aug. 13, 2019

(54) ELECTROSTATIC CHUCK

(71) Applicant: Shinko Electric Industries Co., LTD., Nagano-Ken (JP)

(72) Inventors: Kazuyoshi Miyamoto, Nagano (JP); Kazunori Shimizu, Nagano (JP)

(73) Assignee: Shinko Electric Industries Co., LTD., Nagano-Ken (JP)

( * ) Notice: Subject to any disclaimer, the term of this patent is extended or adjusted under 35 U.S.C. 154(b) by 263 days.

(21) Appl. No.: 15/634,131

(22) Filed: Jun. 27, 2017

(65) Prior Publication Data

US 2018/0005860 A1 Jan. 4, 2018

(30) Foreign Application Priority Data

Jun. 30, 2016 (JP) .................. 2016-131012

(51) Int. Cl.
*H01T 23/00* (2006.01)
*H01L 21/683* (2006.01)
*H02N 13/00* (2006.01)
*H01L 21/687* (2006.01)

(52) U.S. Cl.
CPC ...... *H01L 21/6833* (2013.01); *H01L 21/6831* (2013.01); *H01L 21/6875* (2013.01); *H02N 13/00* (2013.01)

(58) Field of Classification Search
None
See application file for complete search history.

(56) References Cited

U.S. PATENT DOCUMENTS

| 6,022,418 A * | 2/2000 | Iwabuchi | C23C 16/401 |
| | | | 118/500 |
| 2002/0134511 A1* | 9/2002 | Ushioda | C23C 16/4581 |
| | | | 156/345.51 |
| 2015/0370178 A1* | 12/2015 | Klomp | G03F 7/70708 |
| | | | 355/72 |

FOREIGN PATENT DOCUMENTS

JP 2010-205813 A 9/2010

* cited by examiner

*Primary Examiner* — Stephen W Jackson
(74) *Attorney, Agent, or Firm* — Wolf, Greenfield & Sacks, P.C.

(57) ABSTRACT

An electrostatic chuck includes a dielectric layer and a conductive layer located inside the dielectric layer. The dielectric layer includes an upper surface and a plurality of protrusions protruding from the upper surface. Each of the protrusions includes a top portion that serves as an attraction surface on which a substrate is attracted. The dielectric layer includes a plurality of first dielectric portions and a second dielectric portion. The second dielectric portion surrounds each of the first dielectric portions in the upper surface of the dielectric layer. At least some of the first dielectric portions include the protrusions and are bonded to the conductive layer. Each of the first dielectric portions is formed from a material that differs from that of the second dielectric portion.

4 Claims, 3 Drawing Sheets

ELECTROSTATIC CHUCK

CROSS-REFERENCE TO RELATED APPLICATIONS

This application is based upon and claims the benefit of priority from prior Japanese Patent Application No. 2016-131012, filed on Jun. 30, 2016, the entire contents of which are incorporated herein by reference.

FIELD

This disclosure relates to an electrostatic chuck and a method for manufacturing an electrostatic chuck.

BACKGROUND

An apparatus for manufacturing semiconductor elements includes a vacuum processing apparatus, such as a film formation apparatus, an etching apparatus, or the like. The vacuum processing apparatus includes an electrostatic chuck that holds a substrate in a depressurized processing chamber. The electrostatic chuck includes a dielectric layer having an attraction surface and an electrode that applies a voltage to the dielectric layer to attract the substrate to the attraction surface. Japanese Laid-Open Patent Publication No. 2010-205813 describes an example of the electrostatic chuck. In the electrostatic chuck described in the publication, the dielectric layer includes a plurality of protrusions, and a top portion of each protrusion functions as the attraction surface. In such a structure, the degree of contact between a rear surface of the substrate and the protrusions affects the magnitude of the attraction force acting on the substrate.

SUMMARY

The functions required for the electrostatic chuck include attracting the substrate to the attraction surface, removing the substrate from the attraction surface, and withstanding repeated attraction and removal. The material for the dielectric layer has been developed for the purpose of enhancing these functions. In addition to these functions, the electrostatic chuck may require additional functions, such as adapting to high temperature processing of the substrate, reducing the amount of foreign objects attached to the substrate, and the like. The additional functions are different depending on the processing to which the electrostatic chuck is applied. Thus, it is desirable that a variety of functions be provided to the electrostatic chuck.

One embodiment of this disclosure is an electrostatic chuck. The electrostatic chuck includes a dielectric layer and a conductive layer located inside the dielectric layer. The dielectric layer includes an upper surface and a plurality of protrusions protruding from the upper surface. Each of the protrusions includes a top portion that serves as an attraction surface on which a substrate is attracted. The dielectric layer includes a plurality of first dielectric portions and a second dielectric portion. The second dielectric portion surrounds each of the first dielectric portions in the upper surface of the dielectric layer. At least some of the first dielectric portions include the protrusions and are bonded to the conductive layer. Each of the first dielectric portions is formed from a material that differs from that of the second dielectric portion.

Other embodiments and advantages thereof will become apparent from the following description, taken in conjunction with the accompanying drawings, illustrating by way of example the principles of this disclosure.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which.

DESCRIPTION OF THE EMBODIMENTS

Figure 1:
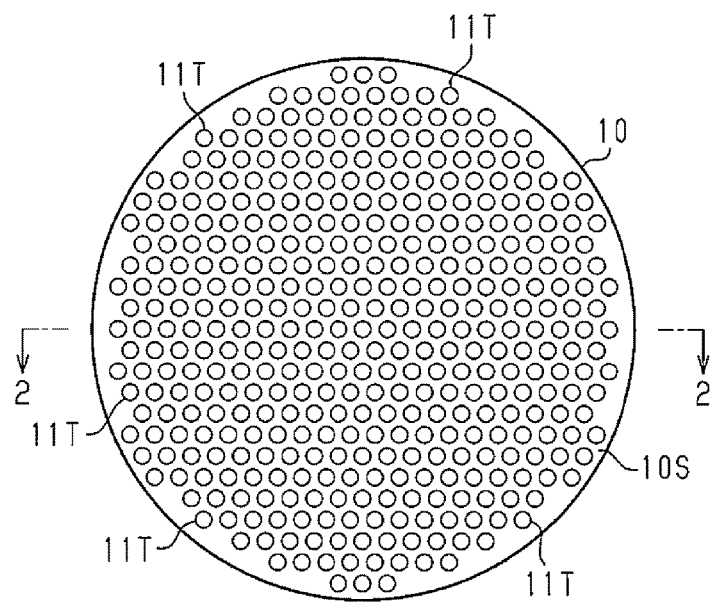
FIG. 1 is a schematic plan view illustrating a structure of an attraction surface of an electrostatic chuck.

One embodiment will now be described with reference to the accompanying drawings. Elements in the drawings may be partially enlarged for simplicity and clarity and thus have not necessarily been drawn to scale.

As illustrated in FIG. 1, an electrostatic chuck includes a dielectric layer 10 that is disk-shaped. The dielectric layer 10 includes an upper surface 10S and a plurality of protrusions 11T protruding from the upper surface 10S. Each of the protrusions 11T includes a top portion that serves as an attraction surface that supports and attracts a substrate. Thus, the protrusions 11T on the upper surface 10S come into contact with a rear surface of the substrate. Each of the protrusions 11T has a taper shape or a hemispherical shape.

The dielectric layer 10 has a diameter of, for example, 300 mm and a thickness of, for example, 1 mm or greater and 10 mm or less. Each of the protrusions 11T has a diameter of, for example, 0.3 mm or greater and 5 mm or less and a thickness of, for example, 3 µm or greater and 30 µm or less. The size of each protrusion 11T and the number of the protrusions 11T may be appropriately determined according to the functions of easily attracting the substrate to the attraction surface, easily removing the substrate from the attraction surface, increasing a voltage resistance, and the like.

The material of the dielectric layer 10 is a ceramics composition and may include at least one selected from a group consisting of aluminum oxide, yttrium oxide, zirconium oxide, aluminum nitride, and silicon nitride as a ceramic. Aluminum oxide is preferably used in terms of ready availability, excellent heat resistance, inexpensive materials, good mechanical resistance, and the like. The dielectric layer 10 may be an amorphous body or a polycrystalline body.

The dielectric layer 10 may include a flux or conductive grains an additive. The material of the flux may be, for example, silicon oxide, calcium carbonate, or magnesium oxide. The material of the conductive grains may be, for example, a high melting point metal, such as tungsten, molybdenum, or tantalum. Alternatively, the material of the conductive grains may be metal carbide, such as titanium carbide, tungsten carbide, tantalum carbide, or molybdenum carbide. Further, the material of the conductive grains may be silicon carbide. The conductive grains may be appropriately added according to the functions of stabilizing the electrical characteristics of the dielectric layer 10, increasing the corrosion resistance of the dielectric layer 10, increasing the heat resistance of the dielectric layer 10, and the like.

Figure 2:
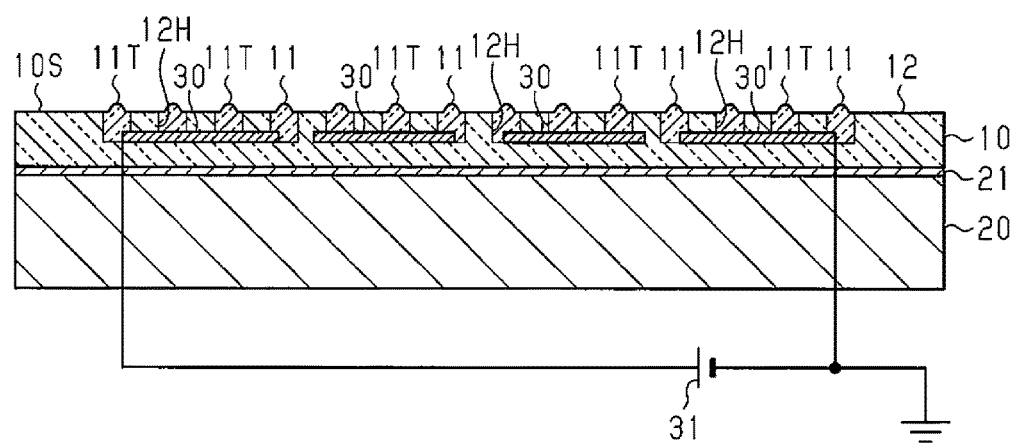
FIG. 2 is a cross-sectional view illustrating the structure of the electrostatic chuck taken along line 2-2 in FIG. 1.

As illustrated in FIG. 2, the electrostatic chuck includes a base plate 20. The dielectric layer 10 is adhered to an upper surface of the base plate 20 by an adhesive layer 21. The base plate 20 has rigidity sufficient to support the dielectric layer 10. The base plate 20 has a thickness of, for example, 35 mm or greater and 40 mm or less.

The material of the base plate 20 may be, for example, a metal such as cemented carbide or a composite of a metal and a ceramics. Aluminum or an aluminum alloy is preferably used in terms of ready availability, easiness to machine, good heat conductivity, and the like. The surface of the base plate 20 may undergo alumite processing. The alumite processing is preferably used in terms of increasing chemical resistance and the like.

The electrostatic chuck includes an electrostatic electrode 30 as one example of a conductive layer. The electrostatic electrode 30 is located inside the dielectric layer 10. The electrostatic electrode 30 is electrically connected to an attraction power supply 31 via supply terminals. The attraction power supply 31 is located outside the electrostatic chuck. The DC voltage applied from the attraction power supply 31 to the electrostatic electrode 30 generates attraction force, which attracts the substrate to the attraction surfaces (top portions of projections 11T), in the dielectric layer 10.

The electrostatic electrode 30 is a thin film electrode that is arranged along the upper surface 10S of the dielectric layer 10. The electrostatic electrode 30 has, for example, a spiral shape as viewed from a direction perpendicular to the upper surface 10S, that is, in a plan view. The electrostatic electrode 30 is located, for example, in the middle of the dielectric layer 10 in the thicknesswise direction. The electrostatic electrode 30 has a thickness that is sufficiently smaller than half the thickness of the dielectric layer 10. The thickness of the electrostatic electrode 30 is, for example, 5 µm or greater and 200 µm or less.

A conductive material for the electrostatic electrode 30 may be, for example, a high melting point metal, such as tungsten, molybdenum, or tantalum. Alternatively, the conductive material of the electrostatic electrode 30 may be metal carbide, such as titanium carbide, tungsten carbide, tantalum carbide, or molybdenum carbide. Further, the conductive material of the electrostatic electrode 30 may be a composite of aluminum oxide and tantalum or a composite of aluminum nitride and tantalum. The high melting point metal is preferably used in terms of a small thermal expansion difference between the dielectric layer 10 and the electrostatic electrode 30, excellent heat resistance, and the like.

The dielectric layer 10 includes a plurality of first dielectric portions 11 and a second dielectric portion 12. At least some of the first dielectric portions 11 include the protrusions 11T and are bonded to the electrostatic electrode 30. Each of the first dielectric portions 11 may include a single protrusion 11T or may include two or more protrusions 11T. The number of the protrusions 11T may be different for each first dielectric portion 11. Further, the dielectric layer 10 may include one or more first dielectric portions 11 bonded to the electrostatic electrode 30 and one or more first dielectric portions 11 not bonded to the electrostatic electrode 30. Further, the dielectric layer 10 may include one or more first dielectric portions 11 including at least one protrusion 11T and one or more first dielectric portions 11 not including the protrusion 11T. Each of the first dielectric portions 11 includes an upper end surface. The upper end surface of each first dielectric portion 11 may be formed by the corresponding protrusion(s) 11T or formed by the corresponding protrusion(s) 11T and the surrounding surface.

The second dielectric portion 12 does not include the protrusion 11T. The second dielectric portion 12 is a single plate-shaped layer that surrounds each of the first dielectric portions 11. The second dielectric portion 12 includes a plurality of partition holes 12 extending through the dielectric layer 10 (second dielectric portion 12) from the upper surface 10S to the electrostatic electrode 30. Each of the partition holes 12H is filled with the corresponding one of the first dielectric portions 11. A boundary between each of the first dielectric portions 11 and the second dielectric portion 12 is a boundary between the materials in the dielectric layer 10. The boundary between the materials in the dielectric layer 10 is, for example, a boundary between different ceramic compositions, a boundary between different density regions, a boundary between different grain diameter distributions, or the like.

The dielectric layer 10 may be configured so that the first dielectric portions 11 include the protrusions 11T as first protrusions and the second dielectric portion includes one or more second protrusions that differ from the first protrusions 11T. The shape of each first protrusion 11T may be the same as, or differ from, the shape of each second protrusion. In such a structure, each of the top portions of the second protrusions also serves as the attraction surface on which the substrate is attracted.

The material of each first dielectric portion 11 differs from the material of the second dielectric portion 12. The combination of the material of each first dielectric portion 11 and the material of the second dielectric portion 12 may be appropriately determined according to the requirements for the electrostatic chuck, such as increasing the heat resistance of the electrostatic chuck, reducing the amount of foreign objects attached to the substrate, increasing the bonding strength between the electrostatic electrode 30 and the dielectric layer 10, reducing the manufacturing cost of the electrostatic chuck, or the like. Examples of the combination of the material of each first dielectric portion 11 and the material of the second dielectric portion 12 will now be described below.

In one example, the material of each first dielectric portion 11 has a volume resistivity that is higher than that of the material of the second dielectric portion 12.

For example, each first dielectric portion 11 has a content percentage of the ceramics that is higher than that of the second dielectric portion 12 so that each first dielectric portion 11 has a higher volume resistivity than the second dielectric portion 12. As an example, each first dielectric portion 11 has the content percentage of the aluminum oxide of, for example, 99.99 wt % or greater, and the volume resistivity of, for example, $10^{16}$ Ωcm. In contrast, the second dielectric portion 12 has the content percentage of the aluminum oxide of, for example, 94 wt % or greater and 96 wt % or less, and the volume resistivity of, for example, $10^{14}$ Ωcm.

The higher the content percentage of the ceramics in each first dielectric portion 11, the lower the content percentage of the additive that contributes the bonding between each first dielectric portion 11 and the electrostatic electrode 30 may become. In this case, it is preferable that the entire lower surfaces of the first dielectric portions 11 and part of the second dielectric portion 12 surrounding each of the first dielectric portions 11 be bonded to the electrostatic electrode 30. In the example illustrated in FIG. 2, each of the first dielectric portions 11 bonded to the electrostatic electrode 30 is surrounded by part of the second dielectric portion 12 that is located between the adjacent first dielectric portions 11 and bonded to the electrostatic electrode 30. When the lower surface of each of the first dielectric portions 11 and the part of the second dielectric portion 12 surrounding each first dielectric portion 11 are bonded to the electrostatic electrode 30, the bonding between the second dielectric portion 12 and the electrostatic electrode 30 allows for compensating for the reduction in the bonding strength between the first dielectric portions 11 and the electrostatic electrode 30.

Further, when each first dielectric portion 11 has an ion content percentage that is lower than that of the second dielectric portion 12, each first dielectric portion 11 has a higher volume resistivity than the second dielectric portion 12. Alternatively, when a composition of the additive added to each first dielectric portion 11 differs from a composition of the additive added to the second dielectric portion 12, each first dielectric portion 11 has a higher volume resistivity than the second dielectric portion 12.

In another example, the material of each first dielectric portion 11 has a frequency of grain separation lower than that of the material of the second dielectric portion 12.

For example, each first dielectric portion 11 has a content percentage of the flux that is lower than that of the second dielectric portion 12 so that each first dielectric portion 11 has a lower frequency of grain separation than the second dielectric portion 12. When the substrate undergoes the plasma processing, the flux included in the dielectric layer 10 is more easily damaged than the ceramics. The content percentage of the flux in the dielectric layer 10 may be appropriately changed within a range that limits the damage of the dielectric layer 10 in the processing of the substrate.

Further, when each first dielectric portion 11 has a porosity that is lower than that of the second dielectric portion 12, each first dielectric portion 11 has a lower frequency of grain separation than the second dielectric portion 12.

In another example, the material of each first dielectric portion 11 has a bonding strength higher than that of the material of the second dielectric portion 12.

For example, the content percentage of the additive that contributes the bonding with the electrostatic electrode 30 is higher in each first dielectric portion 11 than in the second dielectric portion 12 so that the bonding strength between each first dielectric portion 11 and the electrostatic electrode 30 is higher than the bonding strength between the second dielectric portion 12 and the electrostatic electrode 30.

In order to increase the bonding strength between each first dielectric portion 11 and the second dielectric portion 12, it is preferable that the material of each first dielectric portion 11 and the material of the second dielectric portion 12 include the same component and have different composition ratios. When the material of each first dielectric portion 11 and the material of the second dielectric portion 12 include the same component, deformation caused by the difference in thermal expansion between each first dielectric portion 11 and the second dielectric portion 12 is restricted at the boundary therebetween.

In another example, the material of the second dielectric portion 12 is more easily available or less expensive than the material of each first dielectric portion 11.

Next, a method for manufacturing the electrostatic chuck will now be described below.

Figure 3:
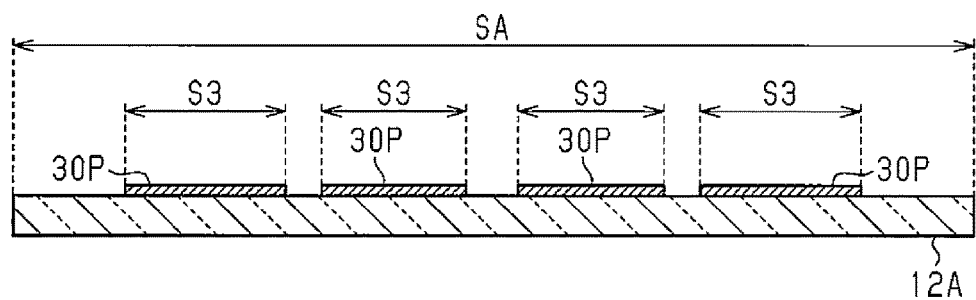
FIGS. 3 to 8 are cross-sectional views illustrating a method for manufacturing the electrostatic chuck.

As illustrated in FIG. 3, a lower green sheet 12A is prepared. The material for forming the lower green sheet 12A corresponds to a first ceramics composition. The shape of the lower green sheet 12A is, for example, a rectangular shape. The material of the lower green sheet 12A includes the ceramics for forming the second dielectric portion 12 as grains.

For example, when the ceramics for forming the second dielectric portion 12 is aluminum oxide, the material of the lower green sheet 12A includes grains of aluminum oxide. The material of the lower green sheet 12A is a mixture of the material of the second dielectric portion 12 and a binder, solvent, or the like.

The lower green sheet 12A includes an upper surface that is set to a lower bonding region SA. A portion of the lower bonding region SA corresponds to a conductive layer region S3. The size of the lower bonding region SA is larger than the upper surface 10S of the dielectric layer 10 as viewed from a direction perpendicular to the upper surface of the lower green sheet 12A, that is, in a plan view. Additionally, the shape of the conductive layer region S3 is the same as the shape of the electrostatic electrode 30 in a plan view.

Next, a conductive pattern 30P is formed in the conductive layer region S3 of the lower green sheet 12A. The material for forming the conductive pattern 30P includes the conductive material for forming the electrostatic electrode 30 as grains. When the conductive material of the electrostatic electrode 30 is tungsten, the material of the conductive pattern 30P includes grains of tungsten.

The material of the conductive pattern 30P is a mixture of the conductive material of the electrostatic electrode 30 and a binder, solvent, or the like. The conductive pattern 30P is formed with, for example, a conductive paste through a printing process.

Figure 4:
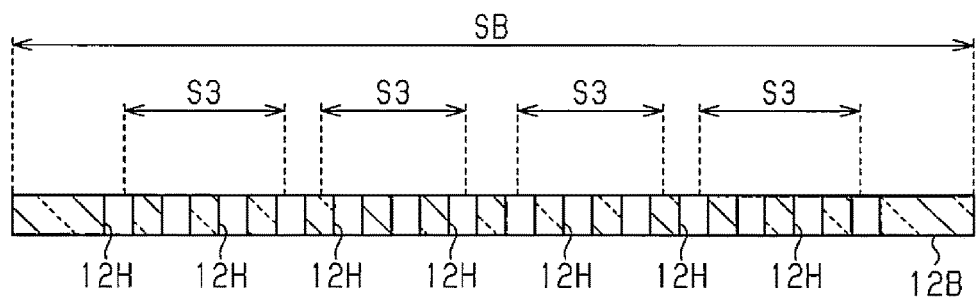

Next, as illustrated in FIG. 4, an upper green sheet 12B is prepared. The shape of the upper green sheet 12B is, for example, a rectangular shape. The upper green sheet 12B has the same size as the lower green sheet 12A. The material for forming the upper green sheet 12B also corresponds to the first ceramics composition. In the same manner as the lower green sheet 12A, the material of the upper green sheet 12B includes the ceramics for forming the second dielectric portion 12 as grains. The material of the upper green sheet 12B is a mixture of the material of the second dielectric portion 12 and a binder, solvent, or the like.

The upper green sheet 12B includes an upper surface that is set to an upper bonding region SB. The size of the upper bonding region SB is larger than the upper surface 10S of the dielectric layer 10 as viewed from a direction perpendicular to the upper surface of the upper green sheet 12B, that is, in a plan view. The upper bonding region SB includes a region corresponding to the conductive layer region S3. In the region corresponding to the conductive layer region S3, the partition holes 12H are formed in the upper green sheet 12B. The partition holes 12H are one example of through holes that extend through the upper green sheet 12B. The partition holes 12H are formed by, for example, laser processing or mechanically processing.

Figure 5:
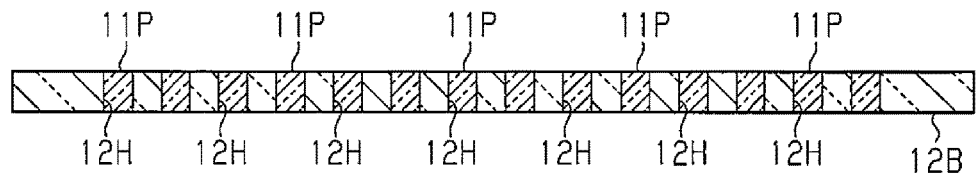

Next, as illustrated in FIG. 5, the partition holes 12H of the upper green sheet 12B are filled with a second ceramics composition to form dielectric patterns 11P. The material of the dielectric patterns 11P includes the ceramics for forming the first dielectric portions 11 as grains.

For example, when the ceramics for forming the first dielectric portions 11 is aluminum oxide, the material of the dielectric patterns 11P includes grains of aluminum oxide. The material of the dielectric patterns 11P is a mixture of the material of the first dielectric portions 11 and a binder, solvent, or the like. The dielectric patterns 11P are formed with, for example, a paste through a printing process.

Figure 6:
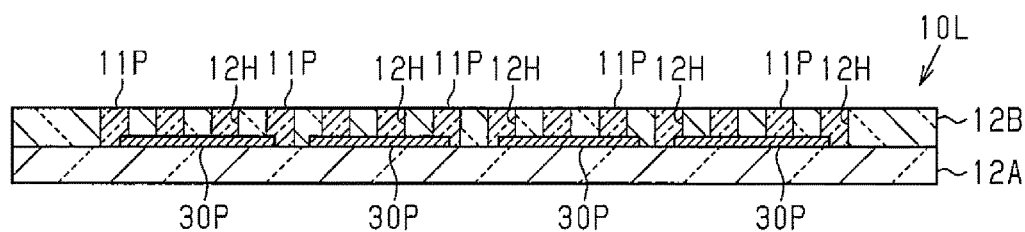

Next, as illustrated in FIG. 6, the upper green sheet 12B including the dielectric patterns 11P is laminated on the lower green sheet 12A including the conductive pattern 30P so that the conductive pattern 30P is sandwiched between the lower and upper green sheets 12A and 12B and so that the lower bonding region SA is aligned with the upper bonding region SB. Consequently, the conductive pattern 30P is connected to the dielectric patterns 11P. Next, the periphery of the lower and upper green sheets 12A and 12B laminated on each other is cut to form a laminated sheet 10L having a disk shape.

Figure 7:
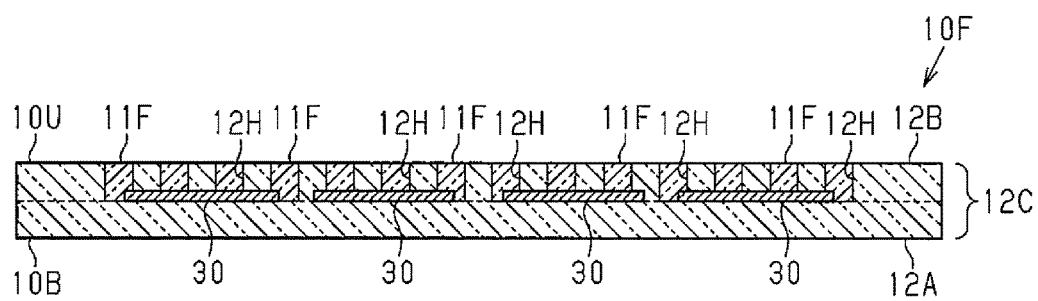

Next, as illustrated in FIG. 7, the laminated sheet 10L is baked to form a baked sheet 10F. The baked sheet 10F is one example of a baked body. The laminated sheet 10L is baked through, for example, an atmosphere baking method or a hot pressing method. The baked sheet 10F includes a single bonded structural body 12C as a bonded body of the lower green sheet 12A and the upper green sheet 12B. The electrostatic electrode 30 is located as a baked body of the conductive pattern 30P inside the bonded structural body 12C. The baked sheet 10F include an upper surface 10U that is formed by a baked body of the upper green sheet 12B and a baked body 11F of each dielectric pattern 11P. The boundary between the baked body 11F of each dielectric pattern 11P and the baked body of the upper green sheet 12B becomes more unclear than the boundary between the baked body of the conductive pattern 30P and the baked body of the upper layer green sheet 12B.

Figure 8:
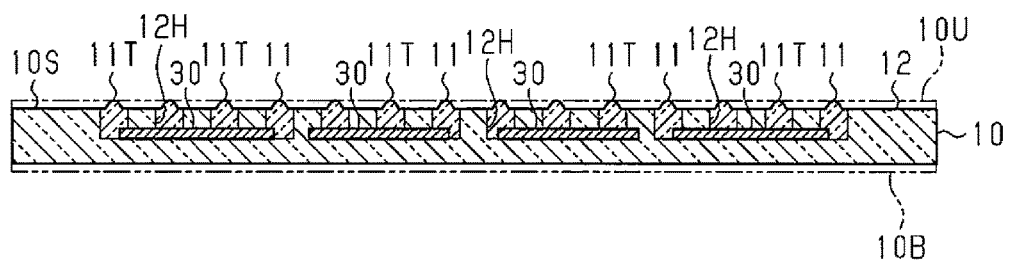

Next, as illustrated in FIG. 8, the upper surface 10U and a lower surface 10B of the baked sheet 10F are polished. Further, the polished upper surface 10U is ground through a blasting process or the like so that the baked body 11F of each dielectric pattern 11P forms the protrusion 11T protruding from the upper surface 10S of the dielectric layer 10. Consequently, the dielectric layer 10, which include the first dielectric portions 11 having the protrusions 11T and the second dielectric portion 12, is formed. Thereafter, the dielectric layer 10 is adhered to the base plate 20 by the adhesive layer 21.

The present embodiment has the following advantages.

(1) The dielectric layer 10 includes the first dielectric portions 11 and the second dielectric layer 12. At least some of the first dielectric portions 11 are bonded to the dielectric electrode 30 and include the protrusions 11T that come into contact with the substrate. When the substrate is removed from the electrostatic chuck, a small current flows through each first dielectric portion 11. This allows for easily removing the substrate from the protrusions 11T. The characteristics inherent to the first dielectric portions 11 that come into contact with the substrate are provided as the functions of the electrostatic chuck. The second dielectric portion 12 surrounds each of the first dielectric portions 11. Therefore, the functions of the second dielectric portion 12 may supplement the functions the first dielectric portions 11 do not have. This allows for adding a variety of functions to the electrostatic chuck.

(2) The ceramics composition having a high volume resistivity enhances the attraction of the substrate to the electrostatic chuck and the removal of the substrate from the electrostatic chuck under a high temperature. When the material of each first dielectric portion 11 has a higher volume resistivity than the material of the second dielectric portion 12, such a function that is suitable for the processing under a high temperature may be provided to the electrostatic chuck.

(3) The ceramics composition having a low frequency of grain separation reduces the amount of foreign objects attached to the substrate. When the material of each first dielectric portion 11 has a lower frequency of grain separation than the material of the second dielectric portion 12, such a function that contributes the reduction in the amount of foreign objects attached to the substrate may be provided to the electrostatic chuck.

The ceramics composition having a high bonding strength with the electrostatic electrode 30 improves the electrical characteristics of the dielectric layer 10. When the material of each first dielectric portion 11 has a higher bonding strength than the material of the second dielectric portion 12, such a function that improves the electrical characteristics of the dielectric layer 10 may be provided to the electrostatic chuck.

The material that is more easily available or less expensive reduces the manufacturing cost of the dielectric layer 10. When the material of the second dielectric portion 12 is more easily available or less expensive than the material of each first dielectric portion 11, the manufacturing cost of the electrostatic chuck may be reduced while enhancing various functions by the first dielectric portions 11.

It should be apparent to those skilled in the art that the foregoing embodiments may be employed in many other specific forms without departing from the scope of this disclosure. Particularly, it should be understood that the foregoing embodiments may be employed in the following forms.

In the above embodiment, the conductive pattern 30P is formed on the lower green sheet 12A. Instead, the conductive pattern 30P may be formed on the upper green sheet 12B. Alternatively, the conductive pattern 30P may be formed on both of the upper green sheet 12B and the lower green sheet 12A. For example, the step of forming the conductive pattern 30P on the lower green sheet 12A is omitted. In this case, after the dielectric patterns 11P are formed in the upper green sheet 12B, the conductive pattern 30P is formed on the lower surface of the upper green sheet 12B. According to this method, it becomes easy to align the dielectric patterns 11P with the conductive pattern 30P. Therefore, it becomes easy to align the first dielectric portions 11 with the electrostatic electrode 30.

The shape of each partition hole 12H may be changed to a taper shape such that the diameter decreases from the electrostatic electrode 30 toward the upper surface 10S or an inversed taper shape such that the diameter decreases from the upper surface 10S toward the electrostatic electrode 30. The taper-shaped partition holes 12H allows for the bonding strength between the electrostatic electrode 30 and the first dielectric portions 11 to be increased. Thus, the function having a high bonding strength may be provided to the first dielectric portions 11 in a preferable manner. The inversely taper-shaped partition holes 12H allows for easy formation of one or more protrusions 11T in the first dielectric portions 11. Thus, the function of increasing the area of contact with the substrate may be provided to the first dielectric portions 11 in a preferable manner.

The structure that supplies a temperature adjustment gas between the substrate and the upper surface 10S of the dielectric layer 10 may be applied to the electrostatic chuck. In this case, some of the first dielectric portions 11 may include protrusions that function as a seal surface for suppressing the leakage of the temperature adjustment gas. Such protrusions (seal surface) may be formed in the same manner as the protrusions 11T in the above embodiment.

When each first dielectric portion 11 has the content percentage of the ceramic that is higher than that of the second dielectric portion 12, the first dielectric portions 11 may also improve the sealing function that suppresses the leakage of the temperature adjustment gas in addition to improving the attraction force.

The upper green sheet 12B may be changed to a laminated body of a plurality of green sheets.

The conductive layer may be embodied as a bipolar electrode functioning as the electrostatic electrode 30. Additionally, the shape of the electrostatic electrode 30 may be a flat plate shape as viewed from a direction perpendicular to the upper surface 10S. Further, the conductive layer may be embodied as a high frequency electrode that generates plasma in a processing chamber in which the electrostatic chuck is provided. Alternatively, the conductive layer may be embodied as a resistance heating element located inside the dielectric layer 10.

In order to reduce the thickness of each first dielectric portion 11, it is preferable to use one of the electrostatic electrode, the high frequency electrode, and the resistance heating element that can be arranged closest to the upper surface 10S, as the conductive layer.

Clause

This disclosure encompasses the following embodiment.

1. A method for manufacturing an electrostatic chuck, the method including:

forming a first green sheet with a first ceramics composition;

forming a conductive pattern on an upper surface of the first green sheet;

forming a second green sheet with the first ceramics composition;

forming a plurality of through holes in the second green sheet;

filling the through holes with a second ceramics composition that differs from the first ceramics composition to form a plurality of dielectric patterns with the second ceramics composition;

laminating the second green sheet on the first green sheet so that the dielectric patterns contact the conductive pattern, thereby forming a laminated sheet including the first green sheet and the second green sheet;

baking the laminated sheet to form a baked sheet; and grinding an upper surface of the baked sheet to form a plurality of protrusion protruding from the upper surface of the baked sheet, wherein each of the protrusions is formed by a baked body of each dielectric pattern.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. An electrostatic chuck comprising:
    a dielectric layer including an upper surface and a plurality of protrusions protruding from the upper surface; and
    a conductive layer located inside the dielectric layer, wherein:
    each of the protrusions includes a top portion that serves as an attraction surface on which a substrate is attracted;
    the dielectric layer includes
        a plurality of first dielectric portions, wherein at least some of the first dielectric portions include the protrusions and are bonded to the conductive layer, and
        a second dielectric portion that surrounds each of the first dielectric portions in the upper surface of the dielectric layer; and
    each of the first dielectric portions is formed from a material that differs from that of the second dielectric portion.

2. The electrostatic chuck according to claim 1, wherein each of the first dielectric portions has a volume resistivity that is higher than that of the second dielectric portion.

3. The electrostatic chuck according to claim 1, wherein each of the first dielectric portions has a content percentage of a ceramics that is higher than that of the second dielectric portion.

4. The electrostatic chuck according to claim 1, wherein at least one of the first dielectric portions bonded to the conductive layer is surrounded by part of the second dielectric portion bonded to the conductive layer.

* * * * *